United States Patent [19]

Hara et al.

[11] 4,088,514
[45] May 9, 1978

[54] METHOD FOR EPITAXIAL GROWTH OF THIN SEMICONDUCTOR LAYER FROM SOLUTION

[75] Inventors: Tohru Hara; Minoru Mihara; Nobuyuki Toyoda, all of Kawasaki, Japan

[73] Assignee: Matsushita Electric Industrial Co., Ltd., Japan

[21] Appl. No.: 675,491

[22] Filed: Apr. 9, 1976

[30] Foreign Application Priority Data

Apr. 17, 1975 Japan .................................. 50-47043
May 9, 1975 Japan .................................. 50-54857

[51] Int. Cl.² .......................................... H01L 21/208
[52] U.S. Cl. .................................. 148/171; 118/415; 148/172; 252/62.3 GA
[58] Field of Search ............................. 148/171, 172; 252/62.3 GA; 118/415

[56] References Cited

U.S. PATENT DOCUMENTS

| | | | |
|---|---|---|---|
| 3,753,801 | 8/1973 | Lockwood et al. | 148/171 |
| 3,853,643 | 10/1974 | Verleur | 148/171 |
| 3,854,447 | 12/1974 | Kobayasi | 148/171 X |
| 3,950,195 | 4/1976 | Rode et al. | 148/171 |

Primary Examiner—G. Ozaki
Attorney, Agent, or Firm—Robert E. Burns; Emmanuel J. Lobato; Bruce L. Adams

[57] ABSTRACT

Thin epitaxial layers of Group III-V semiconductor materials are grown from solution with improved thickness reproducibility and surface smoothness by a method including the steps of preparing an ideally saturated solution of the semiconductor material in a metal melt preferably by keeping an undersaturated solution in contact with the crystalline semiconductor material at a predetermined temperature, supercooling the saturated solution and then bringing the supercooled solution into contact with a substrate. A growth boat assembly for this method has at least one set of two boats slidably stacked one upon another, wherein the upper boat has a solution reservoir and the lower boat has two depressions respectively for receiving therein the substrate and the crystalline semiconductor material as the source material at the saturation step, arranged such that a solution contained in the reservoir can selectively be contacted with either of the source material and the substrate and isolated from both.

4 Claims, 24 Drawing Figures

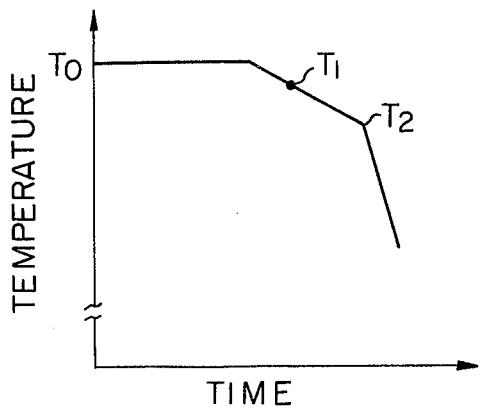
Fig. 3
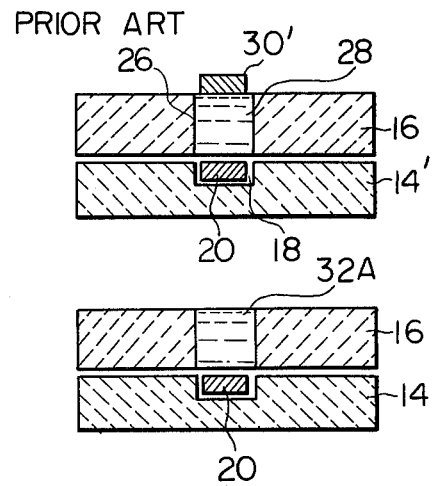
Fig. 4 (A)
Fig. 4 (B)
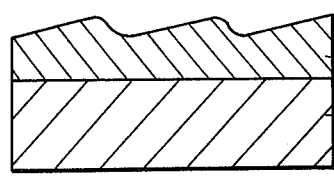
Fig. 5 (A)
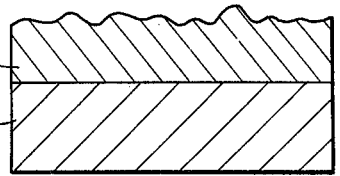
Fig. 5 (B)

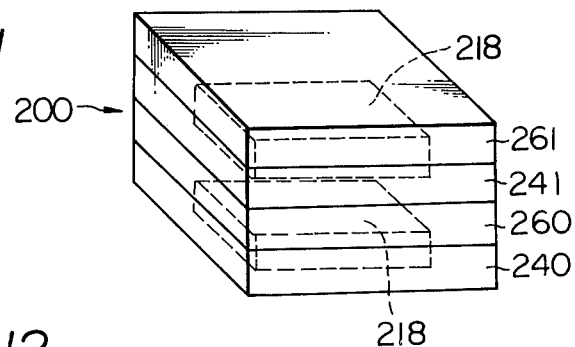
Fig. 11
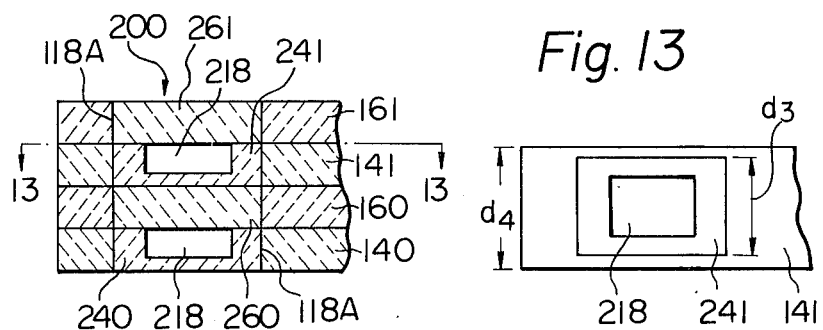
Fig. 12
Fig. 13
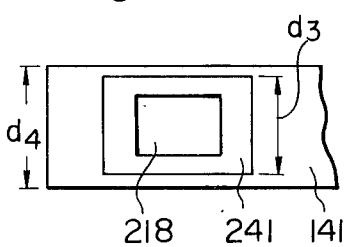
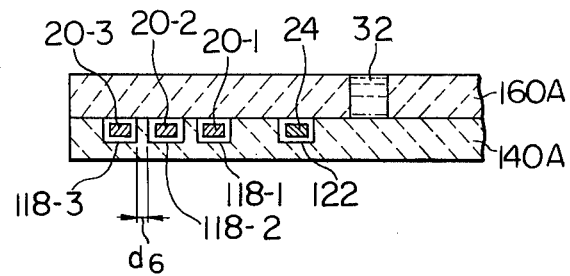
Fig. 14
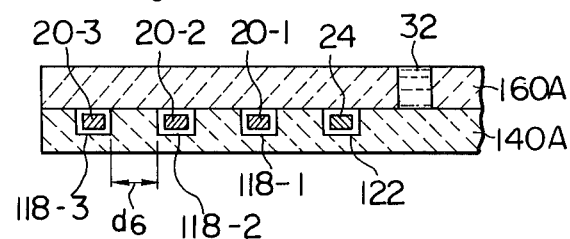
Fig. 15

METHOD FOR EPITAXIAL GROWTH OF THIN SEMICONDUCTOR LAYER FROM SOLUTION

This invention relates to a method for the liquid-phase epitaxial growth of thin layers of Group III–V semiconductor materials from solution and apparatus for performing the same.

Both liquid-phase and vapor-phase techniques have been used in the epitaxial growth of thin layers of Group III–V semiconductor materials. Thin layers grown by liquid-phase epitaxial techniques generally have advantages such as, for example, comparatively few crystal defects, excellent layer-substrate interfacial characteristics and the ability of giving excellent junctions. Accordingly, the epitaxial growth of thin layers of Group III–V semiconductor materials such as, e.g., gallium arsenide, gallium phosphide and gallium aluminum arsenide from solution is widely used in the production of semiconductor devices which are required to have excellent junction characteristics such as semiconductor double hetero LASERs, light-emitting diodes, FET varactor diodes, Gunn diodes, IMPATT diodes and super lattice diodes.

Conventional liquid-phase epitaxial growth methods, however, are not completely satisfactory, particularly for industrial production of semiconductors, because of various problems such as difficulty in precise control of both layer thickness and impurity concentrations, poor thickness reproducibility and unsatisfactory surface smoothness of the grown layers. These problems must be solved both to improve the quality and reproducibility of the products and to reduce the cost of production; however, these problems still remain unsolved.

It is an object of the present invention to provide an improved method for the liquid-phase epitaxial growth of thin layers of Group III–V semiconductor materials from solution, which method brings about by an excellent reproducibility of the thickness of the grown layers, excellent surface smoothness of the grown layers, applicability to mass production and has little affect on misorientations of the substrates.

It is another object of the invention to provide an improved apparatus for efficiently carrying out a liquid-phase epitaxial growth according to the invention.

According to the invention, a method for liquid-phase epitaxial growth of a thin layer of a Group III–V semiconductor material on a substrate crystal from solution comprises the following steps: (a) preparing a precipitate-free and ideally saturated solution of a Group III–V semiconductor material in a metal melt at a predetermined temperature; (b) lowering the temperature of the ideally saturated solution to another predetermined temperature to render it a supercooled solution subsequently to separation of the ideally saturated solution from any source material; and (c) contacting the supercooled solution with a substrate crystal.

The ideally saturated solution is preferably prepared by initially preparing an undersaturated solution at the first mentioned predetermined temperature and then contacting the undersaturated solution with a separate source of the semiconductor material at the same temperature to allow the solution to reach saturation A growth boat assembly according to the invention comprises at least one set of first and second plate-shaped growth boats which are slidably stacked one upon another. The first boat has a first depression for receiving therein a substrate crystal and a second depression for receiving therein a crystalline semiconductor material as a source material, which depressions are formed on the top face of the boat and spaced from one another. The second boat has a vertically bored aperture defining a solution reservoir and is slidably placed on the top face of the first boat such that the solution reservoir can be selectively positioned on the first depression, on the second depression, and between and in isolation from both of the first and second depressions.

The boat assembly can be constituted of a multiplicity of substantially identical sets, e.g. 15 sets, of the first and second boats. The first boat may have at least one additional first depression either with or without the addition of another second depression.

A portion of the boat assembly which portion is in the form of a vertical column including the first depressions may be constructed as a detachable cassette so that the substrates can be placed in and taken out of the first depressions while the boats are in the assembled state.

Other features and advantages of the invention will become apparent from the following detailed description of preferred embodiments with reference to the accompanying drawings, wherein:

FIG. 1 is a schematic elevational view in section of a liquid-phase epitaxial growth apparatus;

FIGS. 2(A)–2(D) are a series of schematic elevational views in section of a part of the apparatus of FIG. 1 showing successive steps of a growth method according to the invention;

FIG. 3 is a time-temperature profile of a cooling step in a growth method according to the invention;

FIGS. 4(A) and 4(B) are a series of views fundamentally similar to FIGS. 2(A)–2(D) but showing successive steps of a conventional growth method;

FIGS. 5(A) and 5(B) are explanatory and sectional views of two representative semiconductor layers with uneven surfaces grown by a method not in accordance with the invention;

Figure 6:
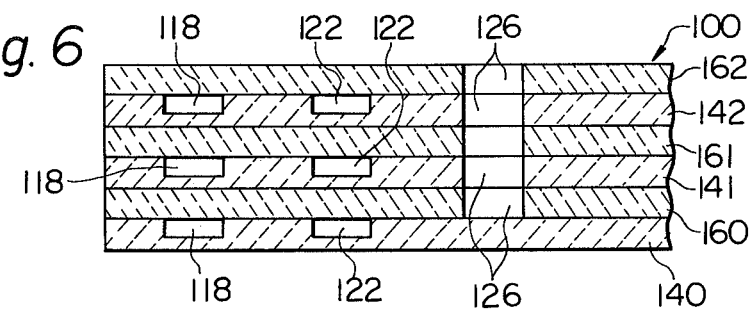
FIG. 6 is an elevational and sectional view of an essential part of a growth apparatus according to the invention.
Figure 8:
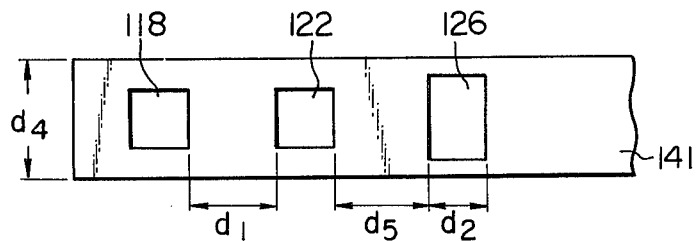
Figure 10:
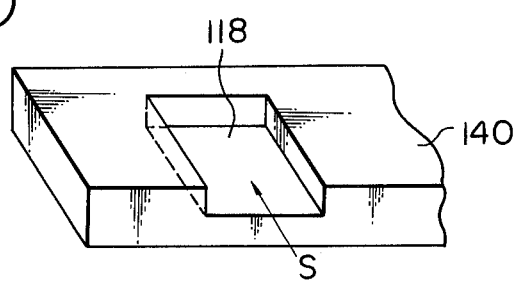
Figure 16:
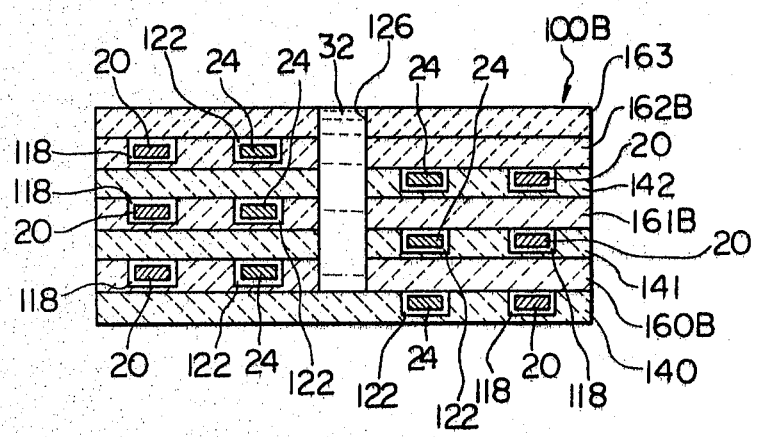

FIGS. 9(A)–9(D) are a series of views fundamentally similar to FIGS. 2(A)–2(D) but showing how the apparatus of FIG. 6 is manipulated for carrying out a method according to the invention;

FIG. 10 is an enlarged and perspective view of a part of the element of FIG. 8;

FIG. 11 is a perspective view of a substrate holder devised for a growth apparatus which is a slight modification of the apparatus of FIG. 6;

FIGS. 12 and 13 are respectively elevational and plan views in section of a part of a growth apparatus which is fundamentally the same as the apparatus of FIG. 6 but includes the element of FIG. 11;

FIGS. 14 and 15 are elevational views in section respectively showing two different modifications of the growth apparatus of FIG. 6; and FIG. 16 is fundamentally similar to FIG. 6 but shows a still different modification.

The invention will hereinafter be described with respect to gallium arsenide as a typical example of Group III–V semiconductor materials. It will be understood from the essential features of the invention, however, that the invention is applicable to other III–V semiconductor materials including ternary systems.

The first procedure of a method according to the invention for the growth of GaAs layers is the preparation of an ideally saturated Ga-As solution which contains As to the solubility limit of Ga-As system at a predetermined temperature but is utterly free from GaAs precipitates.

As is known, it is difficult to practically prepare such an ideally saturated Ga-As solution. However, a recently developed technique is useful for the method of the present invention. This technique employs a growth boat assembly consisting of a solution reservoir, a substrate holder and a thin slider which is sandwiched between the reservoir and the substrate holder and which has an aperture. A large volume of source melt is prepared in the reservoir by the use of Ga melt and a slightly excess amount of GaAs crystals. The source melt is saturated by maintaining it at a predetermined temperature, e.g. at 800° C, for a few tens of hours with precise temperature control. Then a small portion (which is called aliquot) of the saturated solution is metered out from the bottom of the solution reservoir into the aperture of the slider. The thus obtained thin solution in the aperture of the slider is ideally saturated since no GaAs precipitate is present in the bottom region of a large volume of solution in the reservoir.

The present invention, however, provides as a part of the invention a more advantageous technique for the preparation of an ideally saturated source melt as will hereinafter be described.

Figure 1:
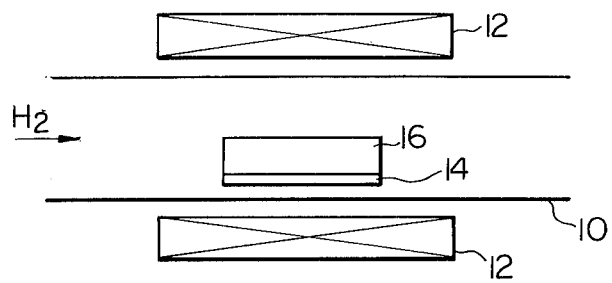
Figure 2A:
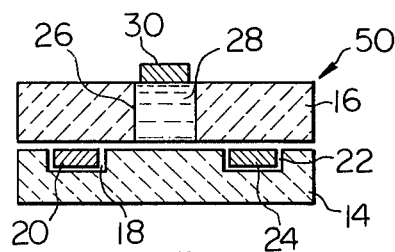
Figure 2B:
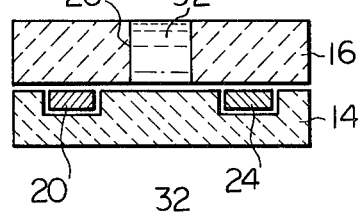
Figure 2C:
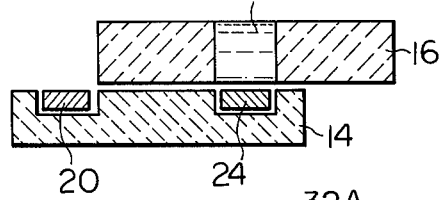
Figure 2D:
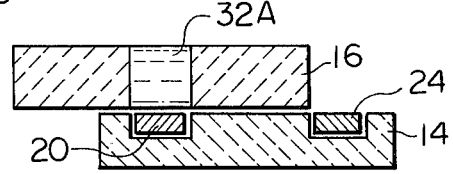

Referring to FIG. 1, liquid-phase epitaxial growth of thin layers in accordance with the invention is carried out in a reaction tube 10 which is usually of quartz and stationarily held in an electric furnace 12. Two graphite boats 14 and 16 are slidably assembled together in a piled arrangement and placed in the reaction tube 10. Hydrogen as a carrier gas is introduced into the reaction tube 10 during a growth run. The reaction tube 10 and the furnace 12 are arranged such that the boat assembly 14 and 16 are entirely maintained in a uniform temperature region. The apparatus and growth conditions are well known ones in these respects.

The growth boats 14 and 16 for carrying out an epitaxial layer growth according to the invention are fundamentally formed as shown in FIG. 2. In this case the lower boat 14 serves as a wafer holder and is horizontally movable. The lower boat 14 has a depression 18 in which a GaAs substrate wafer 20 is held and another depression 22 in which another GaAs wafer 24 as a source material is held. The upper boat 16 has an aperture 26 which serves as a solution reservoir and initially contains a quantity of Ga melt 28. Polyor single crystals of GaAs 30 are placed on the surface of the Ga melt 28 as shown in FIG. 2-(A) in a quantity a little smaller than the quantity given by the Ga-As liquidus curve at a predetermined temperature. The shortage of the GaAs crystals 30 to make a saturated solution at this stage is a feature of the method according to the invention. The amount of the GaAs crystals 30 to be added to the Ga melt 28 need not be measured precisely so long as it is guaranteed that the resulting solution remains undersaturated at the predetermined temperature. It is preferable that the quantity of the GaAs crystals 30 is smaller than the value given by the Ga-As liquidus curve at 800° C by about 5 to about 10%.

Initially, the lower boat 14 is positioned as shown in FIG. 2-(A) so as not to allow any contact of the Ga melt 28 with either the GaAs substrate 20 or the crystal GaAs 24 contained in the depression 22. The boat assembly 50 in this state is kept at 800° C for several hours to allow the GaAs crystals 30 to completely dissolve in the Ga melt 28. As a result, the Ga melt 28 in the reservoir 26 turns to a Ga-As solution 32 as indicated in FIG. 2-(B). Since the amount of the dissolved GaAs 30 was not enough to give a completely saturated solution, no solid-phase GaAs is present in the solution 32.

Then the lower boat 14 is moved to the left side in FIG. 2 until the GaAs wafer 24 in the boat 14 comes into contact with the Ga-As solution 32 in the upper boat 16 as shown in FIG. 2-(C). In this state the GaAs wafer 24 which has been kept at 800° C dissolves gradually into the solution 32 until the solution 32 becomes an ideally saturated solution as given by the Ga-As liquidus curve at 800° C.

After this process, the lower boat 14 is returned to the initial position shown in FIG. 2-(B) where the ideally saturated solution 32A is separated both from the substrate 20 and the GaAs source 24. In this state, the entire system is cooled from 800° C at a constant cooling rate. Referring to FIG. 3, the initial temperature, i.e., 800° C, is indicated at $T_0$. When the temperature of the entire system reaches $T_1$, which is a few degrees below $T_0$ as will hereinafter be described in detail, and the equilibrated Ga-As solution 32A changes to a supercooled solution, the boat 14 is moved to the right side until the top surface of the substrate 20 comes into contact with the solution 32A over the whole area of the substrate 20 as shown in FIG. 2-(D). The cooling procedure is still continued, so that the temperature of the solution 32A still becomes lower than $T_1$. Consequently, epitaxial growth takes place from the supercooled solution 32A on the surface of the substrate 20. It is an advantage of this growth method that the precipitation of GaAs from the solution 32A occurs entirely on the substrate 20 in a short growth time.

When the temperature of the entire system reaches $T_2$, which is usually a few degrees below $T_1$, the boat 14 is moved again to the position shown in FIG. 2-(B) to terminate the layer growth. After that the entire system is cooled to room temperature at a greatly increased cooling rate, and the substrate 20 is taken out of the apparatus. In this cooling procedure, precipitation of GaAs takes place very uniformly in the solution 32A. It is important and necessary that this cooling procedure is performed at a very high cooling rate in order to quickly render the solution used in the above described growth run a uniformly dissolved Ga-As solution 32A in a next run. In a next growth run, a separate substrate 20 is newly placed in the depression 18, but there is no need of renewing the solution 32 and the GaAs source wafer 24 since the ideal solution 32A can again be prepared by repeating the same procedures with the same solution.

The above described method is characterized in that the supercooled solution 32A is prepared by a three-stage process: firstly, preparing an undersaturated solution, then bringing this solution into ideal saturation by the use of the GaAs wafer 24 placed in the depression 22, and finally reducing the temperature with the ideally saturated solution being separated from the GaAs source 24 and the substrate 20. This process may seem troublesome, but in reality brings about remarkable savings of labor and raw materials in addition to a great contribution of the supercooled solution to the quality of the grown layers.

In conventional liquid-phase epitaxial techniques to grow GaAs thin layers, the saturated GaAs solution 32A is prepared by the following process. Referring to FIG. 4, the upper boat 16 for conventional layer growth methods has the solution reservoir 26 which initially contains the Ga melt 28 in a manner similar to the upper boat 16 in FIG. 2. The lower boat 14' holds the GaAs substrate 20 in the depression 18 but has no depression (22) for holding the GaAs source (24). In this case, GaAs crystals 30' are placed on the top of the Ga melt 28 as shown in FIG. 4-(A) in a precisely weighed quantity so that an exactly saturated Ga-As solution may be obtained when the GaAs 30' is completely dissolved in the Ga melt 28 at an intended temperature, e.g., 800° C. The dissolution of the source GaAs 30' is accomplished by keeping the boat assembly in the reaction tube 10 at this temperature for 5-6 hours. When the dissolution of GaAs is completed and the Ga melt 28 turned into the saturated Ga-As solution 32A, the epitaxial growth on the substrate 20 is initiated by the lowering of the temperature of the entire system as described hereinbefore with reference to FIGS. 2 and 3.

This seemingly simple process has numerous disadvantages in practical applications.

(a) The quantity of the source GaAs 30' is determined on the basis of the relationship between the temperature and the solubility of GaAs in Ga, but this relationship is not yet exactly determined. Numerous reports have been presented with disagreement between them: errors of more than ±5% have been recognized.

(b) It is also quite difficult to weigh a small quantity of GaAs with a satisfactorily high precision and good reproducibility for each growth run.

(c) Accordingly, the source GaAs 30' is usually used 10–20% in excess of a reported solubility. Alternatively, the dissolution of GaAs is carried out at an excessively high temperature, e.g., at 850° C, followed by a temperature reduction to the growth temperature, 800° C, to prevent meltback of the substrate 20 into the Ga-As solution 32A upon contact of the substrate 20 with an undersaturated Ga-As solution. Such meltback causes the surface of the substrate 20 to become uneven before the layer growth, and hence the grown layer will have an uneven surface and/or unsatisfactory interface characteristics.

(d) The presence of excess GaAs in the saturated solution 32A has great and unfavorable influences on the surface morphology of the grown layer and on the reproducibility of the layer thickness and/or surface morphology. Homogeneous nucleation chances to occur prior to layer growth and adversely affects the surface morphology of the grown layer. In addition, a large portion of GaAs is precipitated on the surface of the solution 32A. Accordingly, the liquid-phase epitaxial growth of GaAs on the substrate 20 is significantly affected by these unintentional precipitations of GaAs. Since such unintentional precipitation of GaAs does not occur uniformly in every growth run, neither the layer thickness nor the surface morphology of the grown layer is reproducible in successive runs. Therefore, certain measures must be taken to eliminate any unintentional precipitation in Ga-As solution 32A.

(e) An unnecessarily large quantity of Ga which is very expensive is needed to prepare the Ga-As solution 32A, and renewal of the solution 32A (Ga melt 28) is necessary for every growth run.

In the method according to the invention, the weighing of the source GaAs 30 need not be performed with high precision because the solution 32 can be brought to an ideal saturation by the subsequent supply of GaAs from the wafer 24. Besides, no unwanted precipitation on the surfaces or in the solution 32A occurs before and during the layer growth on the substrate 20. As a result, the above described disadvantages of conventional liquid-phase epitaxial growth methods are completely eliminated from a growth method according to the invention. Thin (below 1.0 micron for example) GaAs epitaxial layers can easily be grown by the method according to the invention with excellent surface morphology and thickness control. This method is advantageous also from the economical view-point since the Ga-As solution 32 can be used repeatedly, more than ten times. As a still another advantage of this method, it is possible to moderate the requirement for precision in the temperature control during the growth including the solution preparation steps. In conventional methods, it is necessary to control the temperature in the furnace 12 within ±0.3° C. Accordingly, the furnace 12 is necessarily of an extremely high grade. In the method of the invention, the temperature control of ±1.0° C suffices to the success of the method. Accordingly, a commercially available and relatively inexpensive furnace can be used in the industrial production.

The amount of the supercooling of the ideally saturated Ga-As solution 32A, which is represented by the temperature difference $\Delta T = T_0 - T_1$, is an important factor in a method of the invention. The surface morphology, which may be evaluated quantitatively by the surface roughness, of the grown layers is unsatisfactory either when $\Delta T$ is too large or when too small. In the case of $\Delta T < 0.5°$ C, the so-called terrace morphology appears and becomes significant as $\Delta T$ approaches 0° C, i.e. an equilibrated solution. The terrace morphology disappears and very smooth layer surfaces are obtained when $\Delta T$ is between 0.5° C and 5° C. In most cases, good surface morphology can be attained even if $\Delta T$ is as large as about 10° C. The surfaces become uneven when $\Delta T$ is larger than 10° C. However, it is preferable to carry out the supercooling according to the invention under the restriction that $0.5°$ C $\leq T \leq 5°$ C to attain the best surface morphology and thickness control.

EXAMPLE 1

The growth apparatus of FIGS. 1 and 2 was used. The undersaturated Ga-As solution 32 was prepared from 20g of pure Ga as the melt 28 in the reservoir 26 and 0.80g of polycrystalline GaAs 30 which was placed on the Ga melt 28. This example was for the epitaxial growth of an n-type thin GaAs layer, so that 0.40g of Sn was doped to the Ga melt 28. Of course, other kinds of usually employed impurity elements may be added to the Ga melt 28 and/or the crystalline GaAs 30. For example, Si, Te or Se other than Sn as an n-type impurity and Zn, Ge or Si as a p-type impurity may be used. The crystalline GaAs 30 may be doped with Cr, Mn or $NH_3$.

A 20 × 20mm wide and 1mm thick polycrystal GaAs wafer was placed in the depression 22 of the lower boat 14 as the supplementary GaAs source 24. The substrate 20 was a 20 × 20mm wide and 0.3mm thick wafer of Cr-doped semiinsulating GaAs. The substrate crystal 20 was preliminarily subjected to a usual surface polishing procedure and then to a chemical etching in a bromine-methanol system. The source wafer 24 also was used after chemical etching.

To dissolve the crystalline GaAs 30 in the Ga melt 28, the boat assembly 50 was maintained in the position shown in FIG. 2-(A) and heated gradually in $H_2$ gas stream of 300 ml/min. When the temperature reached 5° C below the intended growth temperature of 800° C, the heating rate was lowered to 10° C/min so that the temperature of the melt 28 would not exceed 800° C. The entire system was kept at 800° C in the $H_2$ gas stream for more than 6 hr. By this process, the source GaAs 30 was completely dissolved in the Ga melt 28. The As concentration in the thus prepared solution 32 was about 10% below the solubility limit of Ga-As system at 800° C.

Then the lower boat 14 was moved and positioned as shown in FIG. 2-(C), so that the solution 32 was allowed to be in contact with the source GaAs wafer 24 which also had been kept at 800° C. The source GaAs 24 dissolved gradually in the undersaturated solution 32, and the ideal solution 32A which was in exact agreement with the solubility limit of Ga-As system at 800° C was obtained in less than 3 hr. Then the lower boat 14 was again brought into the position of FIG. 2-(B) to separate the solution 32A from the source GaAs 24, and the boat assembly 50 was cooled from 800° C at a constant rate of 0.5° C/min. It is an important feature of this invention that the ideal solution 32A (in which no solid-phase GaAs exists at 800° C) be kept out of contact with both the substrate 20 and the source GaAs 24 during this cooling process. When the temperature reached 797° C ($T_1$ in FIG. 3), the lower boat 14 was moved to take the position of FIG. 2-(D) to bring the solution 32A into contact with the substrate 20 over the whole area. Since the cooling was not interrupted, the epitaxial growth of GaAs on the substrate 20 commenced upon its contact with the supercooled solution 32A. The lower boat 14 was kept in this position for about 30 sec until the temperature reached 796.75° C. Then the boat 14 was returned to the position of FIG. 2-(B) to terminate the growth.

Thereafter the cooling rate was increased to more than 30° C/min, and the entire system was cooled to near room temperature with a continued care for uniformly cooling the entire system. Then the boat assembly was taken out of the reaction tube 10, and the substrate 20 was taken out. The epitaxial layer grown on the substrate 20 in this example was 0.5μm thick and was excellent in surface morphology. The surface roughness of this expitaxial layer was far smaller than ±200° A. The grown layer was of n-type GaAs with carrier concentration of $1 \times 10^{17}$ cm$^{-3}$.

Another but identical substrate 20 was placed in the depression 18 of the same boat 14, and the boat assembly 50 was again placed in the reaction tube 10. The solution 32 and the source GaAs 24 which had been used in the above described run were used again. The boats 14 and 16 were positioned as shown in FIG. 2-(B) and kept at 800° C for about 30 min. Although the solution 32 had been cooled at the end of the preceding run, the undersaturated solution 32 was regained in quite a short time because the precipitation of GaAs had taken place very uniformly in this solution. Thereafter the solution 32 was contacted with the source GaAs 24 in the same manner as in the preceding run to prepare the ideally saturated solution 32A. The temperature program and growth procedure were in exact accordance with those of the preceding run. The layer thickness, carrier concentration and surface morphology of the thus grown layer were the same as in the previously grown layer.

This example can be repeated more than ten times without renewal of the solution 32 and the source GaAs 24. The maximum possible number of repetitions depends on the thickness of the grown layers, thickness of the solution 32 and/or the kind and concentration of the added impurity. It is possible to further increase the number of repetitions by replenishing the impurity and/or the crystalline GaAs 24 in the course of the repeated growth runs.

EXAMPLE 2

This example was generally similar to Example 1, but the unsaturated solution 32 was prepared by dissolving 88mg of GaAs crystals (30) in 2.2g of Ga (28). Since the same upper boat 16 was used in this example as in Example 1, the thickness of the solution 32 was far smaller than in the case of Example 1. A graphite block (not shown) was placed, therefore, on the surface of the solution 32 as a weight mass so that the unsaturated solution 32 and the saturated solution 32A would thoroughly wet the surfaces of the source GaAs 24 and the substrate 20, respectively. As a result, epitaxial layers grown in this example were substantially the same as the layers grown in Example 1 in their surface smoothness. The growth run was repeated many times with excellent thickness reproducibility: layers of 0.6±0.4μm were grown. The scattering of the layer thickness in this example was quite narrower than, i.e. about 1/10 of, the scatterings in conventional methods. The use of a thin solution 32 has the advantage of an improved productivity (a shortened growth time in each run). In Example 2 it was possible to shorten the time needed to accomplish each growth run in Example 1 by about 20 to about 35%.

The growth method according to the invention has also the advantage that the surface of the grown layer is extremely smooth practically regardless of crystal orientation of the substrate 20.

It is well known in the art of epitaxial layer growth that the surface morphology of a grown layer is significantly affected by the misorientation of a substrate from a low index plane. For example, in the vapor-phase epitaxial growth of silicon gallium arsenide and gallium phosphorus arsenide, thin layers with smooth surfaces can be grown on small misoriented substrates. The influence of the crystal orientation is more significant in liquid phase epitaxial growth. In the conventional liquid-phase epitaxial growth of gallium arsenide or gallium phosphide, layers having good surfaces can be grown only on the substrates whose misorientation is not greater than 0.1°. If misorientation is greater than 0.1° from a low index plane, the surface of the grown layer is uneven and a terrace morphology appears. The unevenness becomes more significant with increase in the misorientation of the substrate.

In slicing substrate wafers from a GaAs ingot, wafers of better than about 0.2° in misorientation cannot be obtained on production scale because various angular errors are introduced during the following procedures. (a) Attachment of the ingot to a slicing machine. (b) Successive slicing works to obtain many wafers from a single ingot. (c) Polishing and chemical etching of the sliced wafer. When errors for these reasons are summed up, the misorientation of the substrate 20 easily becomes greater than ±1.5° in industrial production. It is very difficult and expensive, therefore, to produce substrates of such a small misorientation as 0.2°.

When a GaAs wafer which was about 0.2° off from the <100> orientation (this inclination angle will hereinafter be called "off-angle") was used as the substrate 20 for the growth of a 0.5μm thick GaAs epitaxial layer by a conventional solution growth method (using a slightly oversaturated Ga-As solution in equilibrated state and the same growth temperature profile as in Example 1), the grown layer had a considerably rough surface (a surface roughness of about ±1000 A). The surface roughness became more significant as the off-angle of the substrate 20 increased. If a 0.5μm thick GaAs epitaxial layer is grown on a GaAs substrate with 0.2° off-angle from the <100> plane by a conventional solution growth method, the layer has an uneven surface and is not suitable to the production of semiconductor devices.

By the liquid-phase epitaxial growth method according to the invention, the layer surface is satisfactorily smooth or mirror-like even when a substrate 20 with a very large off-angle is used as will be illustrated by the following example.

EXAMPLE 3

The ideally saturated Ga-As solution 32A was prepared according to Example 2. The substrate crystal 20 of Cr-doped GaAs was of 1.5° off-angle from the <100> plane. The saturated solution 32A was cooled from 800° C($T_0$) at the same rate as in Example 2 in order to prepare the supercooled solution 32A. The supercooled solution 32A was brought into contact with the substrate 20 when the temperature reached 798° C($T_1$) to grow a 0.5μm thick layer. The surface morphology of the thus grown layer was excellent: the surface roughness was far smaller than ±200 A.

This example was repeated by the use of GaAs substrates 20 with different off-angles of 2.5, 5, 7 and 15 degrees, respectively. The surface morphology of the layers grown on these substrates 20 also was excellent.

The temperature difference, $\Delta T = T_0 - T_1$, is an important factor on the surface morphology of the layer grown by the method according to the invention and should be determined within a certain range, which is variable depending on other factors such as the temperature at which the growth is initiated, the cooling rate for the growth, the thickness of the layer, the thickness of the solution 32A and the off-angle of the substrate 20. With respect to the growth of GaAs layers according to the foregoing examples, it was possible to grow the layers with glassy surfaces by determining the temperature difference $\Delta T$ within the range between 0.5 and 5° C. When the off-angle of the substrate 20 was 1.5° and the temperature difference $\alpha T$ was smaller than 0.5° C, the terrace morphology appeared on the surface of the grown layer as shown (in exaggeration) in FIG. 5-(A) despite the ideal saturation and supercooling of the solution 32A. When $\Delta T$ was larger than 15° C, the surface of the grown layer was irregularly uneven and undulated as shown in FIG. 5-(B).

It will be understood from the nature of the invention that the method of the invention is applicable to various Group III-V semiconductor materials (including ternary systems) exemplified by GaP, InP, InAs, GaSb, InSb and $Ga_{1-x}Al_xAs$ by choosing an appropriate time-temperature profile. For example, epitaxial layers of GaP can be grown in accordance with Example 1 or 2 except for a rise of $T_0$ by about 100° C.

As to the apparatus for carrying out the growth method according to the invention, apparatus for conventional liquid-phase epitaxial growth methods can be used only with a slight modification of the lower boat 14, because only the provision of the depression 22 for holding the crystalline source material 24 is essentially required of the lower boat 14 by the novel method as will have already been understood from the foregoing description with reference to FIG. 2.

This invention provides, however, a further improved apparatus or growth boat assembly for industrially carrying out the growth method according to the invention. As described hereinbefore, the reaction tube 10 and the furnace 12 need not to be designed differently from those which are used in conventional solution growth methods except that the furnace 12 may be of a less precise type. Accordingly, the description of the improved apparatus will hereinafter be presented only with regard to a growth boat assembly.

Figure 7:
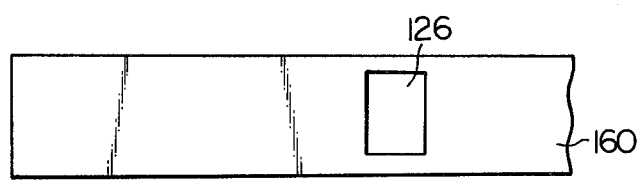
FIGS. 7 and 8 are plan views of two different elements of the apparatus of FIG. 6, respectively.

Referring to FIGS. 6-8, a growth boat assembly 100 is primarily different from the boat assembly 50 of FIG. 2 in that the former 100 is made up of six sheets of graphite plates or boats which are stacked one upon another. The number of these boats is not necessarily limited to six but may optionally be chosen. If the furnace 12 is of a diffusion type as commonly used in the production of silicon transistors having a constant temperature (±1° C) heating zone of 100mm in diameter and 1300mm in length and the reaction tube 10 is 80mm in diameter and 1800mm in length, the boat assembly 100 may consist of up to 30 boats. These six boats are identified by numerals 140, 160, 141, 161, 142 and 162 in the stacked order starting from the lowermost boat 140. The boats 160, 161 and 162 have an identical plan view as shown in FIG. 7. Each of these three boats 160, 161 and 162 has a vertically bored aperture 126 which serves as a solution reservoir like the reservoir 26 of the upper boat 16 in FIG. 2. The boats 141 and 142 are identical with one another and have a plan view as shown in FIG. 8. Each of these two boats 141 and 142 also has the solution reservoir 126 with the same cross section and at the same location as the reservoirs 126 of the boats 160, 161 and 162. In addition, a depression 118 for holding therein the substrate 20 and another depression 122 for holding therein the crystalline source material 24 are formed in the top face of each of these two boats 141 and 142 such that the depression 122 is spaced from and located between the reservoir 126 and the depression 118. As in a conventional boat assembly, the cross section of the reservoir 126 is equal to or slightly larger than the cross section of the depression 118. The distance indicated at $d_1$ between the two depressions 118 and 122 is longer than the length $d_2$ of the reservoir 126. The lowermost boat 140 is identical with the boats 141 and 142 having the depressions 118 and 122 except for the omission of the reservoir 126.

Thus, it will be understood that the six boats of this assembly 100 can fundamentally be divided into two groups, a first group which consists of the boats 160, 161 and 162 having neither of the depressions 118 and 122 and a second group which consists of the boats 140, 141 and 142 having the depressions 118 and 120, and that each of the first group boats 160, 161 or 162 is placed on each of the second group boats 140, 141 or 142. Each boat in the assembly 100 of FIG. 6 is in slidable relation to the adjacent boats, and the boats of one group (boats 140, 141 and 142 in this case) are placed stationary in the reaction tube 10. The remaining boats 160, 161 and 162 can be moved simultaneously both to the right and to the left in FIG. 6 from the outside of the reaction tube 10 by a driving means such as a push rod (not shown). Also it will be understood that the boat assembly 100 consists substantialy of three sets of the boat assembly 50 of FIG. 2 only with additional provision of the reservoir 126 in the lower boat 14 for each set except one set which is placed at the bottom of the assembly 100. A plurality of sets of boat assembly 50 of FIG. 2 are piled up together to give the assembly 100 of FIG. 6 for accomplishing the epitaxial layer growth simultaneously on a plurality of substrates 20 in a single growth run and gaining a full advantage from the solution 32 prepared according to the invention.

Figure 9:
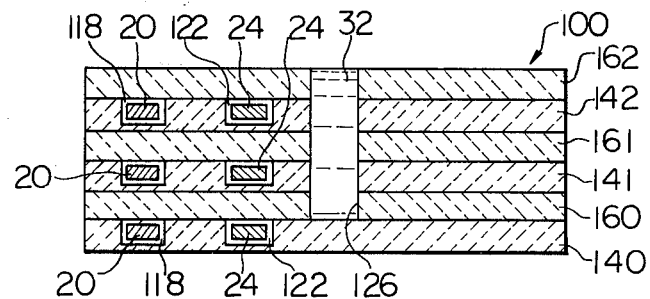
Figure 9:
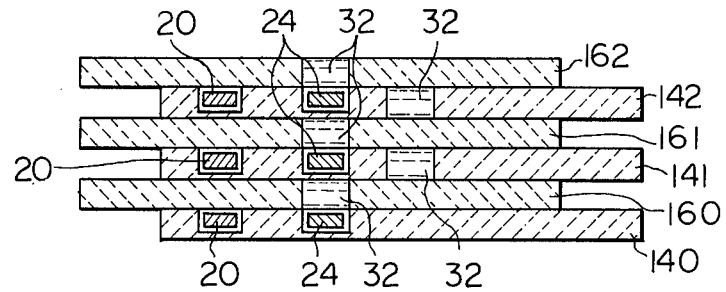
Figure 9:
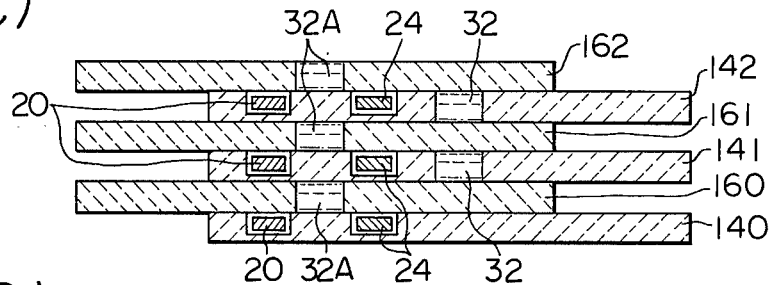
Figure 9:
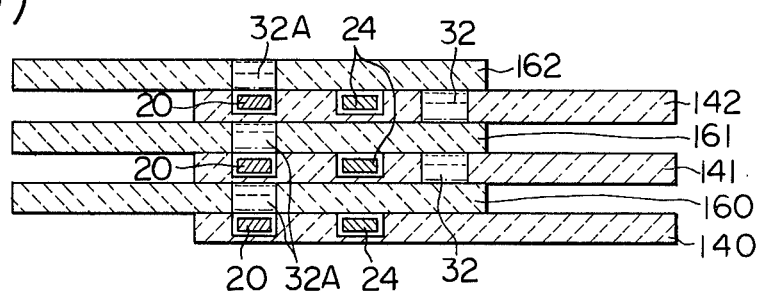

The operation of this boat assembly 100 will be described with reference to FIG. 9. Initially, the six boats are arranged as shown in FIG. 6 or FIG. 9-(A) so that the solution reservoirs 126 of the five boats 160, 141, 161, 142 and 162 may vetically be in exact alignment, and these reservoirs 126 are filled with the undersaturated GaAs solution 32 (the As concentration in this solution 32 is preferably 5–10% below the solubility in the Ga melt 28 at the employed temperature, e.g., 800° C, as described hereinbefore). The GaAs substrate 20 and the GaAs wafer 24 as the supplementary source material for the solution 32 are placed respectively in the depressions 118 and 122 of each of the stationary boats 140, 141 and 142 as illustrated in FIG. 9-(A). The depression 118 is so devised as to be able to admit and detach the substrate 20 even when the six boats are assembled together and kept in the state of FIG. 9-(A) as will hereinafter be explained.

Then the boats 160, 161 and 162 are simultaneously moved to the left to bring the unsaturated solution 32 in the reservoirs 126 of these boats 160, 161 and 162 into contact with the source GaAs 24 in the boats 140, 141 and 142 as shown in FIG. 9-(B). When the undersaturated solution 32 turned into the ideally saturated solution 32A, the three boats 160, 161 and 162 are simultaneously moved further to the left so that the reservoirs 126 thereof may be isolated from both the GaAs sources 24 and the substrates 20 as shown in FIG. 9-(C). In this state, the entire assembly 100 is subjected to a temperature reduction from 800° C at a constant rate of, e.g., 0.5° C/min.

When the temperature reaches a predetermined temperature indicated at $T_1$ in FIG. 3, the three boats 160, 161 and 162 are simultaneously moved to the left until the supercooled solution 32A in the reservoirs 126 thereof come into contact with the substrates 20 as shown in FIG. 9-(D) with continued cooling. Since the temperature is decreasing, GaAs begins to separate from the solution 32A and epitaxially grows on the substrates 20. When the layers are grown to the intended thickness at the temperature of $T_2$ in FIG. 3, the three boats 160, 161 and 162 are simultaneously moved to the right until the assembly 100 takes the position shown in FIG. 9-(C). Thereafter the entire assembly 100 is cooled at an increased rate to near room temperature, and the substrates 20 are taken out of the depressions 118. The thus grown layers on the three substrates 20 are excellent in the surface morphology and practically identical with each other.

As will have been understood, the layers can simultaneously be grown on a plurality of substrates 20 (numerically, ½ of the total number of the boats in the boat assembly 100) in a single run.

Since the depressions 118 and 122 are very short in length relative to the boats, it is possible to further increase the number of layers (i.e., the number of the substrates 20) grown in a single run by forming at least one additional pair of the depressions 118 and 122 in each of the boats 140, 141 and 142 in the same arrangement as and on the left side of the depressions 118 and 122 illustrated in FIG. 9. With 300mm long boats, it is possible to form three pairs of the depressions 118 and 122 in each of the boats 140, 141 and 142. Accordingly, the epitaxial layers can simultaneously be grown on up to 45 (3 × 30/2 sheets) pieces of the substrates 20 in the reaction tube 10 of about 80mm in diameter.

The GaAs solution 32 in the reservoirs 126 of the three boats 160, 161 and 162 can be used repeatedly simply by the steps of heating the boat assembly 100 while in the position of FIG. 9-(C) at 800° C for about 30 minutes and then maintaining the assembly 100 in the position of FIG. 9-(B) until the solution 32 again reaches ideal saturation by the replenishment of GaAs from the GaAs sources 24. The solution 32 as well as the GaAs source 24 can usually be used more than ten times in repetition. It is required of the boat assembly 100, therefore, that the substrates 20 can be renewed without disassembling the boat assembly 100. Accordingly, each depression 118 in FIG. 6 is formed to reach one lateral side of each of the boats 140, 141 and 142 as shown in FIG. 10. The substrate 20 is inserted into the thus formed depression (or an open-ended slot) 118 transversely to the boat 140, 141 or 142 as indicated by the arrow S in FIG. 10. When a growth run is completed and the boat assembly 100 is positioned as shown in FIG. 9-(C), the substrates 20 can be taken out of the depressions 118 either by tilting the boat assembly 100 or by the use of a pair of thin tweezers.

FIGS. 11–13 show another method for easy loading and removal of the substrates 20. In this case, a cassette 200 is prepared as a detachable element of the boat assembly 100. This cassette 200 consists of the same number of graphite plates as the boats which constitute the boat assembly 100. (FIGS. 12–14 show a case when the total number of the boats is four). The graphite plates 240, 260, 241 and 261 of the cassette 200 are stacked one upon another in the same manner as the boats 140, 160, 141 and 161 of the boat assembly 100 and have respectively the same thicknesses as the corresponding boats. The cassette 200 is smaller in width indicated at $d_3$ in FIG. 13 than the width $d_4$ of the boat assembly 100. Each of the graphite plates 240 and 241 which correspond respectively to the boats 140 and 141 has a depression 218 for receiving the substrate 20. The plates 260 and 261 are slidable with respect to the plates 240 and 241. The depressions 118 of the boats 140 and 141 are replaced by vertically bored apertures 118A with the same cross section as the cassette 200, and the boats 160 and 161 also have the same apertures 118A at such a location that the apertures 118A in all the boats 140, 160, 141 and 161 are vertically in alignment as shown in FIG. 12 when the boat assembly 100 is brought to the position shown in FIG. 9-(C). The substrates 20 are placed in the depressions 218 of the graphite plates 240 and 241, and then the cassette 200 is assembled as shown in FIG. 11. The assembled cassette 200 is inserted downwards into the aligned apertures 118A of the boat assembly 100 which is kept in the position of FIG. 9-(C). When a growth run in completed and the boat assembly 100 takes the position shown in FIG. 9-(C), the cassette 200 is taken out of the apertures 118A followed by the insertion of another cassette 200 containing fresh substrates 20 for the next run.

The following Example 4 illustrates the use of the boat assembly 100 (thirty boats) of FIG. 6.

EXAMPLE 4

The reaction tube 10 was 85mm in diameter and about 1800mm in length including constricted end sections. The furnace 12 had about a 450mm long heating zone in which the temperature could be controlled within ±1° C. Thirty boats constituted the boat assembly 100, but reference will be made to the six-boat assembly 100 of FIGS. 6 and 9 for convenience. Each graphite boat was 40mm wide ($d_4$ in FIG. 13), 300mm long and 2mm thick.

In a separate boat (not shown) which was placed in a separate reaction tube, a Ga-As solution 32 was prepared by dissolving 4.2g of GaAs polycrystals and 2.0g of Sn (as an n-type impurity) in 140g of Ga melt which was maintained at 800° C in a $H_2$ stream for 20 hr. The As concentration in the resulting solution 32 was 5–10% below the solubility in Ga at 800° C. This solution 32 was rapidly cooled (at a rate of 20° C/min) and poured into the solution reservoirs 126 of the boat assembly 100 which was in the position shown in FIG. 9-(A).

The substrates 20 were prepared by subjecting 20 × 20mm wide and 30μm thick Cr-doped ($2.0 \times 10^{18} cm^{-3}$) n-type GaAs wafers to usual polishing and chemical etching treatments. The GaAs sources 24 were prepared by treating 20×20mm wide and 300μm thick wafers of Sn-doped ($5.0 \times 10^{16} cm^{-3}$) n-type GaAs similarly to the substrates 20.

The solution reservoirs 126 of the boats were 20mm in length ($d_2$ in FIG. 8). The distance ($d_5$ in FIG. 8) between the reservoir 126 and the depression 122 was 5mm, and the distance $d_1$ between the depressions 118 and 122 in the boats 140, 141 and 142 was 30mm. Both depressions 118 and 120 were 20mm long and 20mm wide.

The substrates 20 and the GaAs sources 24 were placed in the depressions 118 and 122 of the fifteen boats represented by boats 140, 141 and 142. The boat assembly 100 in the state of FIG. 9-(A) was maintained at 800° C in a stream of $H_2$ for 30 min. Then the fifteen boats represented by boats 160, 161 and 162 were moved to the left in FIG. 9 at a constant speed of 20mm/sec to bring the boat assembly into the position shown in FIG. 9-(B). The temperature was maintained at 800° C for another 30 min in this state to obtain the ideally saturated solution 32A. Then the boat assembly 100 was brought into the position of FIG. 9-(C) and the temperature was reduced from 800° C at a rate of 0.5° C/min. After the lapse of 10 min, the supercooled solution 32A in the boats 160, 161 and 162 was brought into contact with the substrates 20 as shown in FIG. 9-(D). The temperature reduction was continued at the same rate. The state of FIG. 9-(D) was maintained for 60 sec, and then the boat assembly was moved again to the position shown in FIG. 9-(C). Thereafter, cooling was carried out at a greatly increased rate to near room temperature, and the substrates 20 are taken out of the boat assembly 100. Thus, a 1.0μm thick epitaxial layer of Sn-doped n-type GaAs with a carrier concentration of $10 \times 10^{17} cm^{-3}$ was grown on each of the fifteen substrates 20. The fifteen layers were practically identical with each other both in thickness and in the surface morphology. The variation in the thickness was smaller than 10% for these fifteen layers. In conventional liquid-phase epitaxial growth methods by which a single layer is grown in each run, layer thickness variation frequently reaches a level of ± about 50%. The surface roughness of the grown layers in this example was below 200 A.

EXAMPLE 5

This example was fundamentally similar to Example 4, but each of the fifteen boats represented by the boats 140, 141 and 142 had two additional pairs of the depressions 118 and 122 which are respectively filled with the substrates 20 and the GaAs sources 24. When the growth on the substrate 20 placed in the extreme right one of the three depressions 118 was completed, the solution 32 in each of the boats represented by 160, 161 and 162 was kept in contact with the GaAs source 24 in the middle one of the three depressions 122 and heated at 800° C for 30 min to replenish the GaAs component consumed by the preceding layer growth. The GaAs layers grown in this Example were of the same quality as the layers obtained in Example 4.

When it is intended to form a plurality of depressions 118 for holding the substrates 20 in each of the boats 140, 141 and 142, the depression 122 for holding the GaAs source 24 need not necessarily be formed in plural so as to individually pair with the depression 118, but, alternatively, a single depression 122 may be formed for a plurality of depressions 118 in the following manner. Referring to FIG. 14, the boat 140A has three identical depressions 118-1, 118-2 and 118-3, and one depression 122. In this case, the distance $d_6$ between the depression 118-2 and either the depression 118-1 or 118-2 is made shorter than the length of the depression 118. In operation, the solution 32A in the reservoir 126 is brought into contact with the three substrates 20 in the three depressions 118-1, 118-2 and 118-3 one by one in numerical order. Since the layer growth on the respective substrates 20-1, 20-2 and 20-3 takes place at different temperatures from the solution 32A whose state is varying, the growth time should be progressively increased for the substrates 20-2 and 20-3 if it is desired to grow the three layers to the same thickness.

In FIG. 15, the three depressions 118-1, 118-2 and 118-3 are spaced from each other such that the distance $d_6$ is equal to the length of the depressions 118. In operation, the solution 32A was kept in contact with the boat 140A at a region between the depressions 118-1 and 118-2 after the completion of the layer growth on the substrate 20-1 and cooled in this state for a while so that the solution 32A returned to an ideally supercooled state in advance of the next layer growth on the substrate 20-2.

FIG. 16 shows a still different modification of the boat assembly 100 of FIG. 6. In this boat assembly 100B, the boats 140, 141 and 142 are not different from these boats in the boat assembly 100 of FIG. 6. Each of boats 160B, 161B, 162B which are placed on the boats 140, 141 and 142, respectively, also has the depression 122 for receiving the source wafer 24 and the depression 118 for receiving the substrate 20. The depressions 118 and 122 in these boats 160B, 161B and 162B are arranged similarly to the depressions 118 and 122 in the boats 140, 141 and 142 but arranged symmetrically on the opposite side of the solution reservoirs 126. In this boat assembly 100B, the boats 160B, 161B and 162B are made to be sliders.

In operation, the substrates 20 and the source wafers 24 are placed in all depressions 118 and all depressions 122, respectively. The boats 160B, 161B and 162B are moved to the right in FIG. 16 until the solution 32 in the reservoirs 126 of these three boats 160B, 161B and 162B come into contact with the source wafers 24 in the boats 140, 141 and 142. In this instance, the source wafers 24 in the moved boats 160B, 161B and 162B come into contact with the solution 32 in the stationary boats 141, 142 and 163 (which is placed uppermost and need not necessarily have the depressions 118 and 122). When the boats 160B, 161B and 162B are moved further to the right to bring the supercooled solution 32A held therein into contact with the substrates 20 in the stationary boats 140, 141 and 142, the substrates 20 is the moved boats 160B, 161B and 162B simultaneously come into contact with the solution 32A in the stationary boats 141, 142 and 163. Due to the utilization of the solution 32 contained in the reservoirs 126 of the stationary boats 141, 142 and 163, the layers can be grown on an increased number of substrates 20 in each growth run by the use of this boat assembly 100B compared with the use of the boat assembly 100 of FIG. 9. The rate of increase in the number of the substrates 20 of the grown layers depends on the number of the boats and is from 50% to nearly 100%.

The time required for accomplishing a single growth run in accordance with the invention is about 1 hour with the factors as in the foregoing examples, and about ¼ of the total time is consumed by the saturation of the solution 32. Accordingly it is very profitable to provide additional source materials (not shown but substantially identical with the source material 24) arranged to come into contact with the upper surface of the solution 32. The saturation of the solution 32 can be completed in about ¼ of the above described time, i.e. about 30 minutes, when the additional source material is arranged appropriately.

What is claimed is:

1. A method for liquid-phase epitaxial growth of a thin layer of a Group III-V semiconductor material on a substrate from solution, comprising the steps of:
    (a) preparing an undersaturated solution of a Group III-V semiconductor material in a metal melt at a predetermined first temperature, the concentration of said semiconductor material in said undersaturated solution being about 5% to about 10% below the solubility of said semiconductor material in said melt at said first temperature;
    (b) contacting said undersaturated solution with a separate source of said semiconductor material at said first temperature to render said undersaturated solution an ideally saturated solution which is free from any precipitate;
    (c) lowering the temperature of said ideally saturated solution at a constant rate to a predetermined second temperature to give a supercooled solution, the difference between said first temperature and said second temperature being within the range between 0.5° C and 5° C, said ideally saturated solution being kept isolated from any source of said semiconductor material at this step;
    (d) contacting said supercooled solution with a substrate which has been brought to said second temperature;
    (e) lowering the temperature of said supercooled solution and said substrate at a constant rate until epitaxial growth on said substrate reaches a desired thickness; and
    (f) separating said supercooled solution from said substrate to terminate the epitaxial growth and lowering the temperature of said substrate at a rate greater than the rate at step (e).

2. A method as claimed in claim 1, wherein said separate source of said semiconductor material is in the crystalline form.

3. A method as claimed in claim 1, further comprising the steps of raising the temperature of said supercooled solution to said first temperature subsequently to the step (f) and thereafter repeating the steps (b) and (c) thereby to repeatedly use the same solution for carrying out the step (c) with a separate substrate.

4. A method as claimed in claim 1, wherein said semiconductor material is GaAs, said metal melt being Ga melt.

* * * * *